(12) United States Patent
Niijima

(10) Patent No.: US 6,456,134 B2
(45) Date of Patent: Sep. 24, 2002

(54) DUTY CYCLE DISCRIMINATING CIRCUIT HAVING VARIABLE THRESHOLD POINT

(75) Inventor: Shinji Niijima, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/822,419

(22) Filed: Apr. 2, 2001

(30) Foreign Application Priority Data

Apr. 6, 2000 (JP) ........................................ 2000-104572

(51) Int. Cl.$^7$ ................................................ H03K 3/017
(52) U.S. Cl. ........................ 327/175; 327/36; 327/37; 377/16
(58) Field of Search ................................. 327/172–174, 327/175, 176, 31, 33, 35, 36–38; 375/238; 377/39, 49, 16, 20; 369/47.46, 189

(56) References Cited

U.S. PATENT DOCUMENTS

| 4,423,498 A | * | 12/1983 | Kimura et al. | 369/47.46 |
| 5,424,668 A | * | 6/1995 | Kohsaka | 327/175 |
| 5,444,403 A | * | 8/1995 | Nagasawa | 327/172 |

FOREIGN PATENT DOCUMENTS

| JP | 1-84475 | 3/1989 |
| JP | 2-22567 | 1/1990 |
| JP | 6-150635 | 5/1994 |
| JP | 2600598 | 1/1997 |

OTHER PUBLICATIONS

NEC Preliminary User's Manual μPD784928, 784928Y Subseries Jun. 1998.

\* cited by examiner

*Primary Examiner*—Timothy P. Callahan
*Assistant Examiner*—Minh Nguyen
(74) *Attorney, Agent, or Firm*—Whitham, Curtis & Christofferson, P.C.

(57) ABSTRACT

A duty cycle discriminating circuit used, for example, in a VTR includes an up/down counter with sign bit for counting up or counting down a count clock signal depending on a potential level of a signal to be discriminated. It also includes an up counter for counting up the count clock signal, and an addend data generating circuit for producing an addend data having a value corresponding to a predetermined proportion of a count value of the up counter. There is an addition circuit with sign bit for adding a count value of the up/down counter and the addend data produced by the addend data generating circuit. The sign bit of the addition circuit is outputted as a discrimination result signal of the duty cycle discriminating circuit. The predetermined proportion of the count value up counter is specified to perform duty cycle discrimination of the signal by using a desired threshold point.

17 Claims, 14 Drawing Sheets

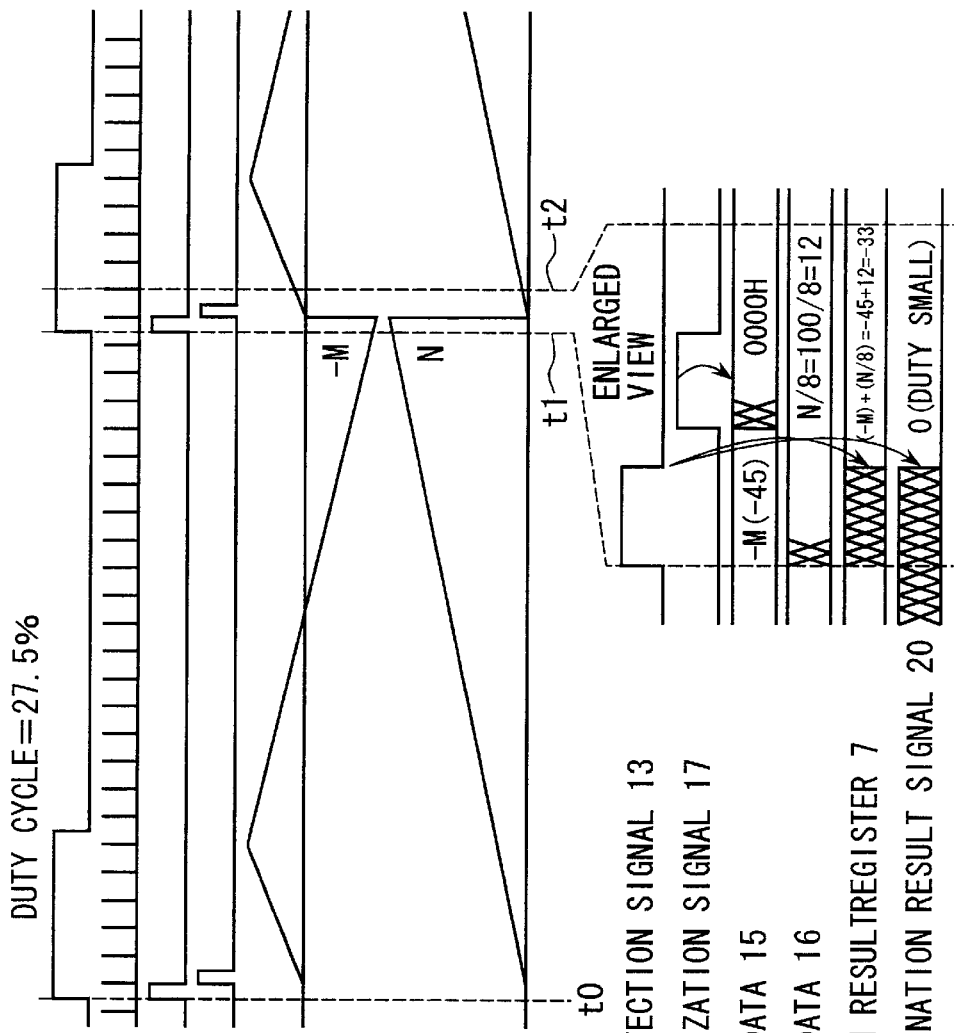
FIG. 3A  SIGNAL TO BE DISCRIMINATED 10
FIG. 3B  COUNT CLOCK 12
FIG. 3C  EDGE DETECTION SIGNAL 13
FIG. 3D  INITIALIZATION SIGNAL 17
FIG. 3E  VALUE OF VUDC 1
FIG. 3F  VALUE OF UP COUNTER 2
FIG. 3G  EDGE DETECTION SIGNAL 13
FIG. 3H  INITIALIZATION SIGNAL 17
FIG. 3I  AUGEND DATA 15
FIG. 3J  ADDEND DATA 16
FIG. 3K  ADDITION RESULT REGISTER 7
FIG. 3L  DISCRIMINATION RESULT SIGNAL 20

FIG. 4

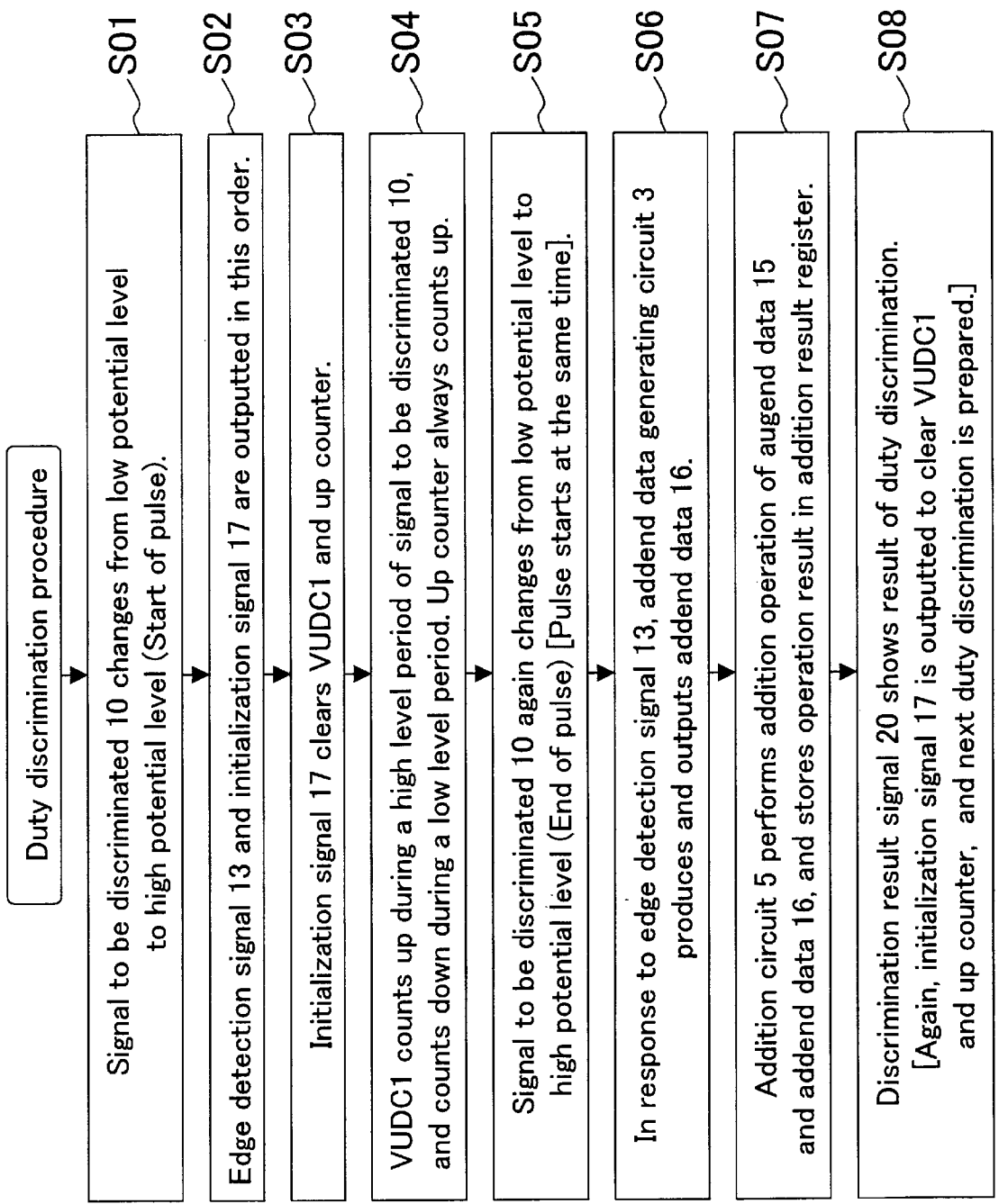

- S01: Signal to be discriminated 10 changes from low potential level to high potential level (Start of pulse).
- S02: Edge detection signal 13 and initialization signal 17 are outputted in this order.
- S03: Initialization signal 17 clears VUDC1 and up counter.
- S04: VUDC1 counts up during a high level period of signal to be discriminated 10, and counts down during a low level period. Up counter always counts up.
- S05: Signal to be discriminated 10 again changes from low potential level to high potential level (End of pulse) [Pulse starts at the same time].
- S06: In response to edge detection signal 13, addend data generating circuit 3 produces and outputs addend data 16.
- S07: Addition circuit 5 performs addition operation of augend data 15 and addend data 16, and stores operation result in addition result register.
- S08: Discrimination result signal 20 shows result of duty discrimination. [Again, initialization signal 17 is outputted to clear VUDC1 and up counter, and next duty discrimination is prepared.]

Duty discrimination procedure

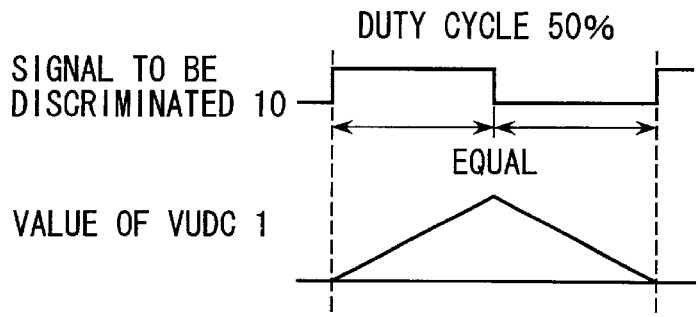
FIG. 5AA  SIGNAL TO BE DISCRIMINATED 10  DUTY CYCLE 50%
FIG. 5AB  VALUE OF VUDC 1
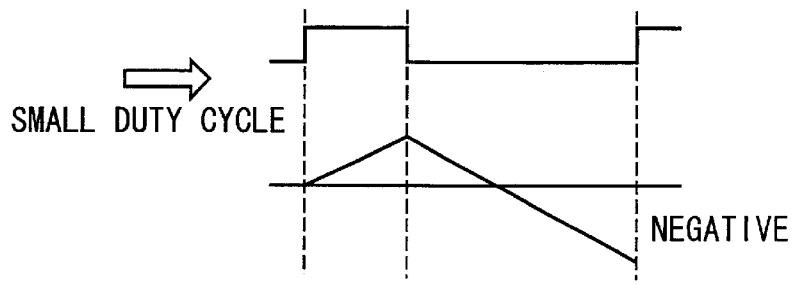
FIG. 5BA
SMALL DUTY CYCLE
FIG. 5BB
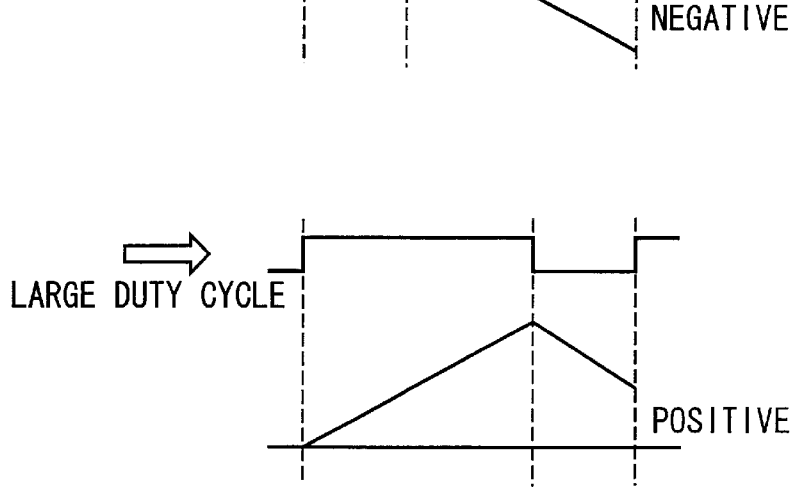
FIG. 5CA
LARGE DUTY CYCLE
FIG. 5CB
FIG. 5DA  SIGNAL TO BE DISCRIMINATED 10  DUTY CYCLE 25%
FIG. 5DB  VALUE OF VUDC 1
FIG. 5DC  VALUE OF UP COUNTER 2

FIG. 11A PRIOR ART PBCTL SIGNAL

FIG. 11B PRIOR ART UDC COUNT VALUE (RE-LOAD=00H)

FIG. 11C PRIOR ART DISCRIMINATION RESULT SIGNAL

FIG. 12

| Count value (C) of up counter 2 | Output of addend data gen. circuit 3 [ shift C by 3 bits] (K) | Duty threshold point (%) [((C-K)/C)/2] (P) | Error (%) [P-43.75] |
|---|---|---|---|
| 100(01100100B) | 12 | 44.00 | 0.25 |
| 101(01100101B) | 12 | 44.06 | 0.31 |
| 102(01100110B) | 12 | 44.12 | 0.37 |
| 103(01100111B) | 12 | 44.17 | 0.42 (max) |
| 104(01101000B) | 13 | 43.75 | 0.00 |
| ... | ... | ... | ... |
| 111(01101111B) | 13 | 44.14 | 0.39 |
| 112(01110000B) | 14 | 43.75 | 0.00 |
| ... | ... | ... | ... |
| 200(11001000B) | 25 | 43.75 | 0.00 |
| ... | ... | ... | ... |
| 207(11001111B) | 25 | 43.96 | 0.21 |
| 208(11010000B) | 26 | 43.75 | 0.00 |

| Bypass designating signal 31 | Positive-negative designating signal 32 | Shift number designating signal 30 | Duty threshold point |
|---|---|---|---|
| 0 | 0 | 0 | app. 44% |
| 0 | 0 | 1 | app. 38% |
| 0 | 1 | 0 | app. 56% |
| 0 | 1 | 1 | app. 63% |
| 1 | x (don't care) | x (don't care) | 50% |

| Multiplication constant designating signal 200 | Duty threshold point |
|---|---|
| 0.9375(1111B) | app. 3% |
| 0.875(1110B) | app. 6% |
| 0.8125(1101B) | app. 9% |
| 0.75(1100B) | app. 13% |
| ... | ... |
| 0.5(1000B) | 25% |
| 0.4375(0111B) | app. 28% |
| ... | ... |
| 0.25(0100B) | app. 38% |
| 0.1875(0011B) | app. 41% |
| 0.125(0010B) | app. 44% |
| 0.0625(0001B) | app. 47% |

DUTY CYCLE DISCRIMINATING CIRCUIT HAVING VARIABLE THRESHOLD POINT

FIELD OF THE INVENTION

The present invention relates generally to a duty cycle discriminating circuit, and more particularly to a duty cycle discriminating circuit which is used, for example, in a video tape recorder and the like and in which a threshold point of duty cycle discrimination can be varied.

BACKGROUND OF THE INVENTION

A duty cycle discriminating circuit or a pulse width discriminating circuit is used, for example, in a video tape recorder (VTR), such as a VHS type VTR, and the like. The duty cycle discriminating circuit is used for determining whether a duty cycle of an input pulse signal is larger or smaller than a threshold value.

As one of conventional duty cycle discriminating circuits, there is known a discriminating circuit used in a VISS detecting circuit which is integrated in μPD78492x series IC devices manufactured by NEC Corporation.

The VISS is an abbreviation of VHS Index Search System and is used, for example, for detecting or indexing a start portion of a playback video signal. In the VISS detecting circuit, a duty cycle discriminating circuit is used to detect a predetermined binary pattern, that is, a VISS pattern corresponding an index signal. The predetermined binary pattern is represented by using binary "1" and "0" corresponding to different duty cycles of a control signal recorded, for example, on a VHS video tape.

FIG. 10 is a block diagram showing a conventional duty cycle discriminating circuit used in the VISS detecting circuit. FIG. 11 is a timing diagram showing an operation of the duty cycle discriminating circuit of FIG. 10. The duty cycle discriminating circuit of FIG. 10 comprises an up/down counter with sign bit or a signed up/down counter 51, a preset value register 52, an edge detecting circuit 55, a control register 56, and a latch circuit 58.

The up/down counter 51 receives a count clock signal FCLK having a fixed frequency. The up/down counter 51 also receives a playback control signal (PBCTL signal), and performs a count up operation or a count down operation depending on the potential level of the PBCTL signal. For example, when the PBCTL signal is "0", the up/down counter 51 performs a count down operation, and when the PBCTL signal is "1", the up/down counter 51 performs a count up operation. An enable/clear of the up/down counter 51 is controlled by a signal from the control register 56.

The preset value register 52 stores a data value to be written into the up/down counter 51. The data value is outputted from the preset value register 52 in synchronization with a falling edge of a re-load signal supplied from the edge detecting circuit 55.

The most significant bit (MSB) of the up/down counter 51 is a sign bit. When the sign bit is "0", the up/down counter 51 shows a positive number, and when the sign bit is "1", the up/down counter 51 shows a negative number. This most significant bit (MSB) is inputted to the latch circuit 58. The latch circuit 58 may be a D-type flip-flop circuit, and holds the MSB of the up/down counter 51 in response to a rising edge of the re-load signal outputted from the edge detecting circuit 55. The MSB held by the latch circuit 58 becomes an output signal, that is, a discrimination result signal, of the duty cycle discriminating circuit.

The edge detecting circuit 55 outputs a re-load signal when it detects an edge designated by the content of the control resistor 56.

It is possible to write data into the control register 56 and into the preset value register 52 from a central processing unit (CPU) and the like which is disposed outside of this pulse width discriminating circuit and which is not shown in the drawing.

With reference to FIGS. 11A–11C, an operation of the conventional duty cycle discriminating circuit of FIG. 10 will be described briefly. As shown in the timing diagrams of FIGS. 11A–11C, the conventional duty cycle discriminating circuit of FIG. 10 discriminates duty cycles by using the up/down counter 51 with a sign bit or a signed up/down counter 51. The up/down counter 51 counts up the count clock signal FCLK during a period in which the PBCTL signal is in a high potential level, and counts down the count clock signal FCLK during a period in which the PBCTL signal is in a low potential level.

Usually, in order to reduce an error of discrimination, when the duty cycle of the PBCTL signal is to be discriminated, a middle value between the possible duty cycles is previously stored in the preset value register 52.

That is, in the VISS detection, the PBCTL signal has a duty cycle of 60% and a duty cycle of 30% (correctly, 27.5%), corresponding, for example, to "0" and "1" for representing binary data. Therefore, discrimination between these two kinds of duty cycles is performed by using a duty cycle of approximately 45%, which is a middle value between 60% and 30%, as a threshold point.

In order for the up/down counter 51 to become zero after one period of the PBCTL signal when the PBCTL signal having a duty cycle of 45% is inputted into the up/down counter 51, it is necessary to store a count value corresponding to 10% of one period of the PBCTL signal into the preset value register 52. As an example, when one period of the PBCTL signal corresponds to 200 clock pulses, it is necessary to store data "20" into the present value register 52.

In this structure, when the duty cycle of the PBCTL signal is larger than 45%, for example, 60%, the count value of the up/down counter 51 with sign bit becomes a positive value, and when the duty cycle of the PBCTL signal is smaller than 45%, for example, 30%, the count value of the up/down counter 51 with sign bit becomes a negative value. Thereby, it is possible to discriminate the duty cycle of the PBCTL signal.

As a second prior art technology for duty cycle discrimination, the following method is known which is not shown in the drawing.

That is, in this method, a counter and two registers A and B are used. The counter receives and counts up a clock pulse signal having a constant period. The registers A and B store count values of the counter during particular times specified by a signal to be measured or discriminated. The register A stores a count value corresponding to a time during which the signal to be measured is in a high potential level, and the register B stores a count value corresponding to one period of the signal to be measured.

The duty cycle of the signal to be measured is obtained by performing an arithmetic operation on the values stored in the registers A and B by an external CPU.

That is, the duty cycle is obtained by the following arithmetic operation.

Duty cycle=(count value of register A)/(count value of register B)

This method is very simple, and provides a precise duty cycle value.

As a third prior art technology, there is known a duty cycle discriminating circuit in which a period of a count clock signal is selected depending on a period of an input signal, that is, a count value of the input signal. Thereby, even if a period of the input signal varies over a wide range, it is possible to discriminate a duty cycle by using a constant re-load value.

However, with respect to the first prior art method, when a videotape is wound forward (fast-forward) or rewound in a video tape recorder (VTR), the period of the PBCTL signal varies depending on variations in motor speed. Even in such case, it is necessary to correctly discriminate the duty cycle of the PBCTL signal. In this case, in order to detect whether the PBCTL signal shows the VISS pattern or not, it is only necessary to discriminate the duty cycle between two kinds of duty cycles, that is, between 30% and 60%.

In the timing diagram of FIG. 11, the initial re-load value of the up/down counter 51 is 00H, that is, zero in hexadecimal notation. However, usually, when the duty cycle discrimination is to be performed, a middle value between the two kinds of duty cycles is previously stored in the preset value register 52, and the middle value stored in the preset value register 52 is re-loaded onto the signed up/down counter 51.

However, when a period of the PBCTL signal varies, the count value of the up/down counter 51 with sign bit after elapsing one period of the PBCTL signal also varies largely. Therefore, it is necessary to also change the value stored in the preset value register 52 according to the variation of the PBCTL signal.

If the value stored in the preset register 52 is not changed, it is impossible to correctly discriminate the duty cycle of the PBCTL signal. In order to change the value stored in the preset value register 52, it is necessary to produce the value to be stored in the preset value resistor 52, by using an external CPU and the like.

Also, the data to be stored in the preset register 52 is produced based on the expectation or anticipation of the period of the PBCTL signal to be inputted next time. Therefore, there is a possibility that an error of the data becomes large and it is difficult to determine when the data to be stored in the preset value register 52 is changed.

In the second prior art mentioned above, it is necessary to calculate the duty cycle every period of the signal to be discriminated, that is, the PBCTL signal, by the CPU. Therefore, when the period of the PBCTL signal becomes small, for example, 100 μs, in a condition the video tape is wound forward (fast-forward) or rewound in a VTR, a processing load of the CPU becomes large. In the duty cycle discrimination of the VISS system, it is not necessary to obtain a precise duty cycle value, but it is only necessary to discriminate between the larger duty cycle and the smaller duty cycle. Therefore, it is a waste of CPU processing power to perform arithmetic operation for obtaining a duty cycle value every period of the PBCTL signal.

With respect to the third prior art method, since it is necessary to change a period of a count clock signal depending on a period of an input signal, that is, a PBCTL signal, a structure of the duty cycle discriminating circuit becomes complicated. Also, it is difficult to appropriately change the period of the count clock signal according to the up/down count period.

SUMMARY OF THE INVENTION

It is an object of the present invention to obviate the disadvantages of the conventional duty cycle discriminating circuits.

It is another object of the present invention to provide a duty cycle discriminating circuit in which a duty cycle of an input signal can be discriminated with a reduced error of discrimination.

It is still another object of the present invention to provide a duty cycle discriminating circuit in which a duty cycle of an input signal can be discriminated with a reduced error of discrimination and which has a simple circuit structure.

It is still another object of the present invention to provide a duty cycle discriminating circuit in which a duty cycle of an input signal can be discriminated with a reduced error of discrimination even when a period of the input signal varies greatly.

It is still another object of the present invention to provide a duty cycle discriminating circuit in which a duty cycle of an input signal can be discriminated without using an external CPU and the like for providing a discrimination threshold value and the like.

It is still another object of the present invention to provide a duty cycle discriminating circuit in which a duty cycle of an input signal can be discriminated without using an external CPU and the like for providing a discrimination threshold value and the like and with a reduced error of discrimination even when a period of the input signal varies greatly.

According to an aspect of the present invention, there is provided a duty cycle discriminating circuit comprising: an up/down counter with sign bit for counting up or counting down a count clock signal depending on a potential level of a signal to be discriminated; an up counter for counting up the count clock signal regardless of the potential level of the signal to be discriminated; an addend data generating circuit for producing an addend data having a value corresponding to a predetermined proportion of a count value of the up counter; and an addition circuit with sign bit for adding a count value of the up/down counter and the addend data produced by the addend data generating circuit, the sign bit of the addition circuit with sign bit is outputted as a discrimination result signal of the duty cycle discriminating circuit; wherein the predetermined proportion of the count value of the up counter is specified to perform duty cycle discrimination of the signal to be discriminated by using a desired threshold point of duty cycle discrimination.

In this case, it is preferable that the duty cycle discriminating circuit further comprises an edge detecting circuit which detects a leading edge of the signal to be discriminated and outputs a pulse like edge detection signal in response to the detection thereof.

It is also preferable that the duty cycle discriminating circuit further comprises a delay circuit which receives the edge detection signal and delays the edge detection signal for a predetermined time to output an initializing signal.

It is further preferable that the up/down counter is initialized by the initialization signal and the most significant bit (MSB) of the up/down counter is outputted as a sign bit.

It is advantageous that the addition circuit comprises an adder for adding the count value of the up/down counter and the addend data produced by the addend data generating circuit, and an addition result register for storing a result of addition of the adder, a sign bit of the addition result register being outputted as a discrimination result signal of the duty cycle discriminating circuit.

It is also advantageous that, in the addend data generating circuit, the count value from the up counter is right shifted by a predetermined number of bit or bits and "0" is inserted to each of corresponding number of upper bit or bits to obtain the addend data.

It is further advantageous that the count value from the up counter has 16 bits and is right shifted by 3 bits and wherein "0" is inserted to each of the upper 3 bits of the right shifted data to obtain 16 bits data as the addend data.

It is preferable that the addend data generating circuit comprises a plurality of registers storing count values from the up counter after right shifting the count value by different number of bits respectively, and a first selector for selectively outputting data stored in the registers depending on a shift number designating signal.

It is also preferable that the addend data generating circuit further comprises a complementary circuit which receives the data outputted from the first selector and generates a complementary data of the data outputted from the first selector, and a second selector for selectively outputting the data outputted from the first selector or the complementary data depending on a positive-negative designating signal.

It is further preferable that the addend data generating circuit further comprises a third selector for selectively outputting the data outputted from the second selector or the count value of the up down counter depending on a bypass designating signal.

It is advantageous that the duty cycle discriminating circuit comprises, in place of the addend data generating circuit, a multiplier circuit which receives the count value of the up counter, the edge detection signal and a multiplication constant designating signal, and which multiplies the count value of the up counter and a constant inputted as the multiplication constant designating signal in synchronization with an input of the edge detection signal to generate the addend data.

It is also advantageous that the duty cycle discriminating circuit further comprises a delay circuit which receives the edge detection signal and delays the edge detection signal for a predetermined time to output an initializing signal.

It is further advantageous that the addition circuit comprises an adder for adding the count value of the up/down counter and the addend data produced by the addend data generating circuit, and an addition result register for storing a result of addition of the adder, a sign bit of the addition result register being outputted as a discrimination result signal of the duty cycle discriminating circuit.

It is preferable that the addition circuit comprises an augend data register for storing the count value of the up/down counter as an augend data in response to a rising edge of the edge detection signal, an addend data register for storing the addend data in response to the rising edge of the edge detection signal, an adder for adding the data stored in the augend data register and the data stored in the addend data register, and an addition result register for storing a result of addition of the adder in response to a falling edge of the edge detection signal.

It is also preferable that the duty cycle discriminating circuit further comprises a delay circuit which receives the edge detection signal and delays the edge detection signal for a predetermined time to output an initializing signal.

It is further preferable that, in the addend data generating circuit, the count value from the up counter is right shifted by a predetermined number of bit or bits and "0" is inserted to each of corresponding number of upper bit or bits to obtain the addend data.

It is advantageous that the count value from the up counter has 16 bits and is right shifted by 3 bits and wherein "0" is inserted to each of the upper 3 bits of the right shifted data to obtain 16 bits data as the addend data.

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which:

FIGS. 3A through 3L are timing diagrams used for explaining an operation of the duty cycle discriminating circuit according to the first embodiment of the present invention shown in FIG. 1;

FIG. 4 is a flowchart showing a process of duty cycle discrimination in the duty cycle discriminating circuit of FIG. 1;

FIGS. 5AA and 5AB, FIGS. 5BA and 5BB, FIGS. 5CA and CB, and FIGS. 5DA, 5DB and 5DC are waveform diagrams illustrating a principle of operation of the duty cycle discriminating circuit according to the present invention;

FIG. 12 is a table showing a result of duty cycle discrimination in the duty cycle discriminating circuit according to the first embodiment of the present invention;

FIG. 13 is a table showing a result of selection of the threshold point of duty cycle discrimination in the duty cycle discriminating circuit according to the second embodiment of the present invention; and FIG. 14 is a table showing a result of duty cycle discrimination in the duty cycle discriminating circuit according to the third embodiment of the present invention.

DESCRIPTION OF A PREFERRED EMBODIMENT

Figure 1:
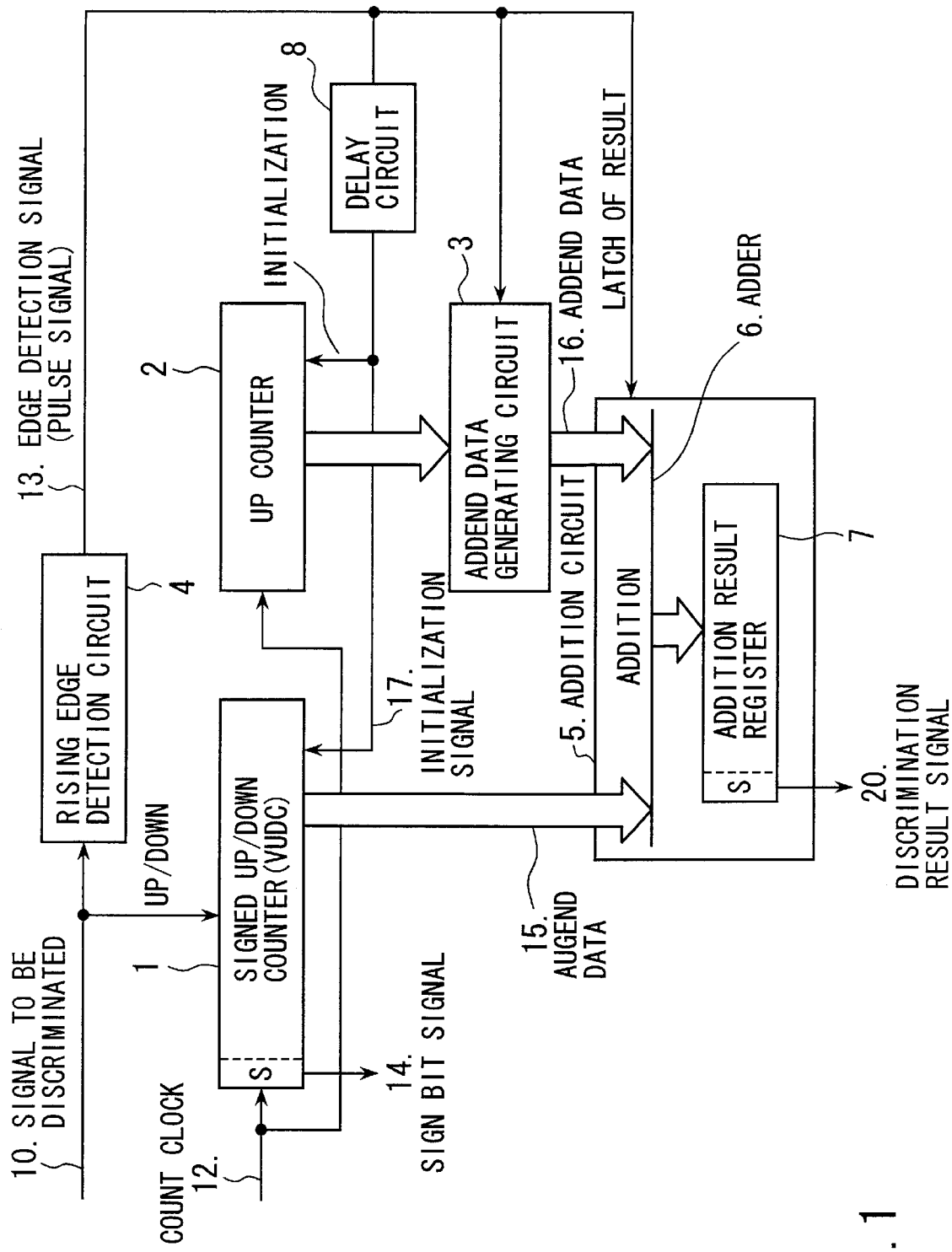
FIG. 1 is a block circuit diagram showing a structure of a duty cycle discriminating circuit according to the first embodiment of the present invention.

First, with reference to the drawings, an explanation will be made on the first embodiment of the present invention. FIG. 1 shows a block circuit structure of a duty cycle discriminating circuit according to the first embodiment of the present invention.

As shown in FIG. 1, the duty cycle discriminating circuit according to the first embodiment of the present invention comprises a signed up/down counter 1 or an up/down counter 1 with sign bit, an up counter 2, an addend data (or addition data) generating circuit 3, a rising edge detecting circuit 4, an addition circuit 5, and a delay circuit 8.

The up/down counter 1 (VUDC1) with sign bit counts up or counts down a count clock 12 supplied thereto, depending on a status of a signal to be discriminated 10, such as a playback control (PBCTL) signal, whose duty cycle is to be discriminated. The up/down counter 1 is initialized or cleared by an initialization signal 17 supplied thereto. The up/down counter 1 outputs the most significant bit (MSB) thereof as a sign bit signal 14.

The up counter 2 counts up the count clock 12, and is initialized or cleared by the initialization signal 17.

The addend data generating circuit 3 accepts a count value of the up counter 2, and generates and outputs an addend data 16. Operation of the addend data generating circuit 3 is controlled by an edge detection signal 13 supplied from the rising edge detecting circuit 4.

The rising edge detecting circuit 4 produces the edge detection signal 13 which is a pulse-like signal generated when each of leading edges of the signal to be discriminated 10 is detected.

The delay circuit 8 receives the edge detection signal 13 and delays the edge detection signal 13 for a predetermined time period, to output the initialization signal 17.

The addition circuit 5 includes an adder 6 and an addition result register 7. The adder 6 receives the addend data 16 from the addend data generating circuit 3, and a data to be added or augend data 15 which is a count value of the up/down counter 1. The addition circuit 5 performs an addition operation of the addend data 16 and the augend data 15 by the adder 6 according to the control based on the edge detection signal 13, and stores the result of addition in the addition result register 7. The addition circuit 5 outputs the value of the sign bit, that is, the MSB, of the addition result register 7, as a discrimination result signal 20.

Figure 2:
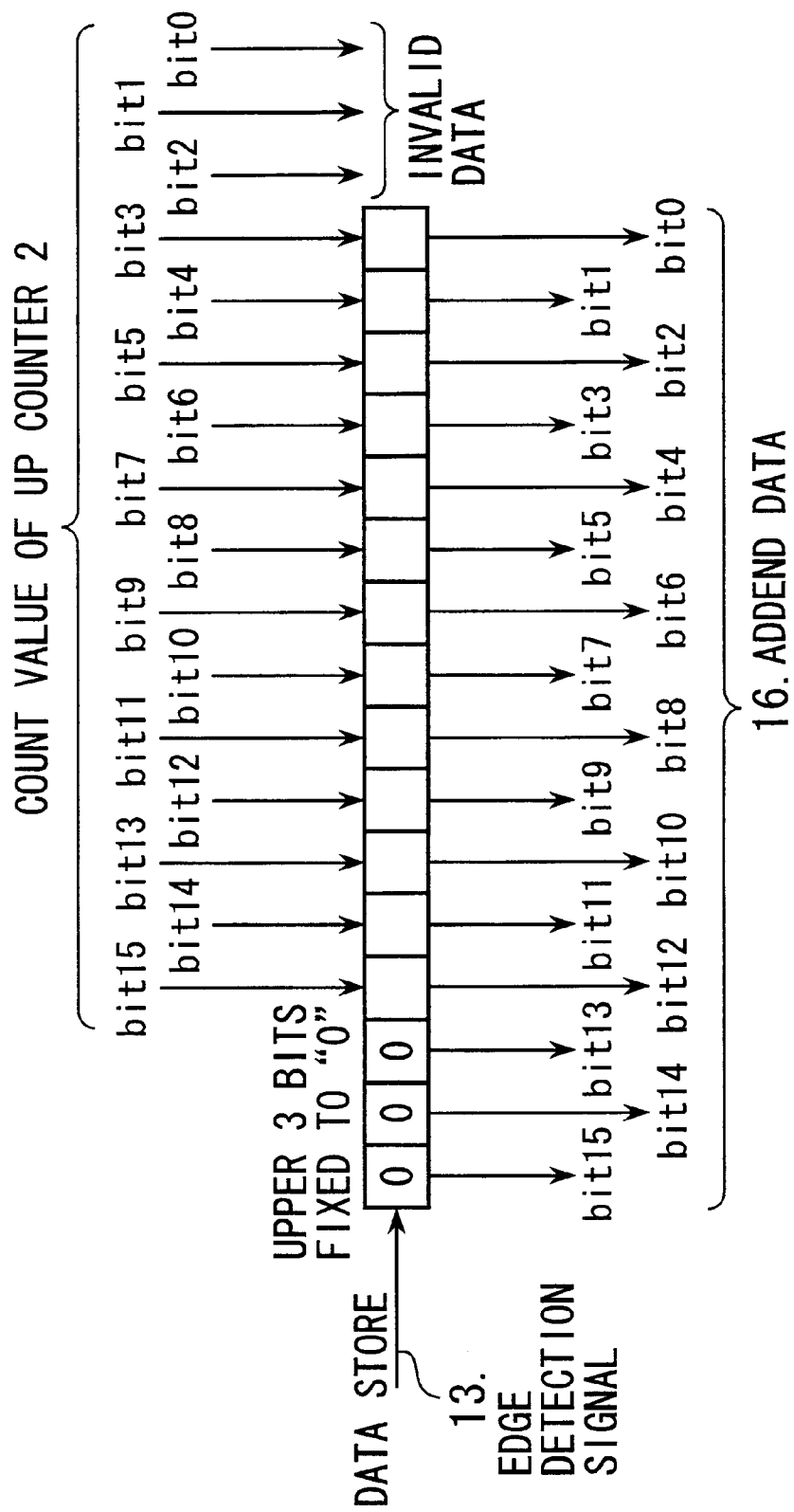
FIG. 2 is a block circuit diagram showing a detailed structure of an addition data generating circuit used in the duty cycle discriminating circuit of FIG. 1.

FIG. 2 shows a detailed structure of the addend data generating circuit 3 of FIG. 1 according to the first embodiment. As shown in FIG. 2, the addend data generating circuit 3 comprises, for example, a register which accepts and stores an input binary value in synchronization with the edge detection signal 13 and outputs it to the addition circuit 5. In particular, in the addend data generating circuit 3, the count value having, for example, 16 bits in length from the up counter 2 is shifted right by three (3) bits and inputted into lower 13 bits of the addend data generating circuit 3 in synchronization with the edge detection signal 13. In this case, zero ("0") data is inputted into upper three bits of the addend data generating circuit 3. Thereby, the addend data generating circuit 3 produces the addend data 16 having 16 bits in length whose upper three bits are all zeros and whose lower 13 bits correspond to the upper 13 bits of the count value of the up counter 2. Therefore, the value of the addend data 16 corresponds to the value which is one eighth of the count value of the up counter 2.

A description will now be made on an operation of the duty cycle discriminating circuit according to the first embodiment of the present invention.

First, with reference to FIGS. 5AA–5DC, a reason will be explained why "discrimination based on a threshold point other than the middle duty cycle" can be realized according to a characteristic feature of the present invention by using the above-mentioned structure.

FIG. 5AA and FIG. 5AB, FIG. 5BA and FIG. 5BB, FIG. 5CA and FIG. 5CB, and FIG. 5DA and FIG. 5DB show relationships between duty cycles of the signals to be discriminated 10 and count values of the up/down counter 1 in various duty cycles of the signals to be discriminated 10. FIG. 5DC shows variations of a count value of the up counter 2 in case the duty cycle of the signal to be discriminated 10 is 25%.

FIG. 5AA shows a condition in which the signal to be discriminated 10 has a duty cycle of 50%. In this case, since an up count period and a down count period of the up/down counter 1 with sign bit (VUDC1) are equal to each other, the count value of the up/down counter 1 after inputting signal pulses of one period becomes "0", as shown in FIG. 5AB.

Therefore, as shown in FIGS. 5BA and BB, when the duty cycle of the signal to be discriminated 10 is smaller than 50%, the count value of the up/down counter 1 after one period becomes negative, and the sign bit signal 14 of the up/down counter 1 shows "1". Also, as shown in FIGS. 5CA and CB, when the duty cycle of the signal to be discriminated 10 is larger than 50%, the count value of the up/down counter 1 after one period becomes positive, and the sign bit signal 14 of the up/down counter 1 shows "0".

In this way, when the threshold point of the duty cycle discrimination of the signal to be discriminated 10 is set to 50%, it is possible to discriminate the duty cycle from the sign bit signal 14 of the up/down counter 1.

FIG. 5DA shows a condition in which the signal to be discriminated 10 has a duty cycle of 25%. In such case, the down count period of the up/down counter 1 becomes three times the up count period of the up/down counter 1. Therefore, assuming that the maximum value of the up/down counter 1 during the up count period is "n", the count value of the up/down counter 1 after one period becomes "−2n".

The value "n" varies depending on the period of the signal to be discriminated. However, the count value of the up/down counter 1 after one period always becomes "−2" if the duty cycle of the signal to be discriminated is 25%.

Therefore, when the threshold point for detection is to be set to 25%, it is possible to add a value corresponding to "2n" to the count value of the up/down counter 1 after one period. Thereby, it is possible to discriminate the duty cycle from the sign bit of the sum value obtained by adding the value corresponding to "2n" and the count value of the up/down counter 1, that is, from the discrimination result signal 20 which corresponds to the sign bit of the data stored in the addition result register 7.

Here, an explanation will be made on the data to be added to the count value of the up/down counter 1. As mentioned above, since the value "2n" varies depending on the period of the signal to be discriminated 10, it is necessary to produce the data to be added to the count value of the up/down counter 1, by using information of the period of the signal to be discriminated 10.

In the present invention, the up counter 2 is used to count the period of the signal to be discriminated 10. In the example illustrated in FIGS. 5DA and 5DB, the count value of the up counter 2 after one period becomes "4n" as shown in FIG. 5DC. Therefore, the data to be added to the count value of the up/down counter 1 can be obtained by dividing the count value of the up counter 2 by "2".

As mentioned above, according to the present invention, after elapsing one signal period of the signal to be discriminated 10, a value produced based on a count value corresponding to the signal period is added to the up/down counter 1. Thereby, it is possible to perform "duty cycle discrimination based on a threshold point other than the middle point", of the signal to be discriminated 10.

Next, as an example, an explanation will be made on the application of the above-mentioned duty cycle discriminating circuit to a VISS detection circuit of a Video Tape Recorder (VTR).

As mentioned before, "VISS" is the abbreviation of VHS Index Search System, and is a system for performing detection of a start point of a playback image or indexing a playback image.

In a VTR, for example, a VHS type VTR, when recording a TV program and the like on a videotape, a control signal is also recorded on the videotape, together with an image or video signal of the TV program and the like. The control signal indicates playback timing of the image signal. When playing back the recorded image signal, the image signal is outputted in synchronization with a playback control (PBCTL) signal. In the VISS application, when recording the control signal, the duty cycle of the control signal is changed to indicate information showing a head portion of the recorded image signal. By using the playback control signal (PBCTL signal) including the information indicating the head portion, a desired image signal portion can be located.

In particular, when a PBCTL signal has a duty cycle of 60%, the PBCTL signal does not show the head or indexing portion, but shows a non-VISS portion. When a PBCTL signal has a duty cycle of 27.5% for a predetermined number of periods, the PBCTL signal shows the head or indexing portion, that is, a VISS portion. The PBCTL signal is a playback signal from a videotape and, therefore, the period of the PBCTL signal varies continuously depending on a tape speed. The present invention provides a duty cycle discriminating circuit which can perform discrimination of a duty cycle required in the VISS system based on an optimum threshold point and by using a simple structure and process.

In the duty cycle discriminating circuit according to the first embodiment of the present invention shown in FIG. 1, the above-mentioned PBCTL signal is shown as the signal to be discriminated 10. Also, in FIG. 1 and FIG. 2, the duty cycle of the signal to be discriminated 10 is discriminated by using a threshold point of approximately 44% (theoretically, 43.75%).

With reference to FIGS. 3A–3L and FIG. 4, an explanation will be made on an operation of the duty cycle discriminating circuit according to the first embodiment shown in FIGS. 1 and 2.

As shown in FIG. 3A, the signal to be discriminated 10 changes from a low potential level to a high potential level and, in response thereto, the rising edge detecting circuit 4 outputs an edge detection signal 13 which is a pulse like signal. The delay circuit 8 delays the edge detection signal 13 and generates an initialization signal 17. The initialization signal 17 is supplied to the up/down counter 1 and the up counter 2, and initializes or clears these counters 1 and 2. Thereafter, during a time in which the signal to be discriminated 10 is in a high potential level, the up/down counter 1 counts up the count clock pulses 12. After the potential level of the signal to be discriminated 10 has changed from a high potential level to a low potential level, the up/down counter 1 counts down the count clock pulses 12.

On the other hand, the up counter 2 always counts up the count clock pulses 12 until it is cleared. When the potential level of the signal to be discriminated 10 again changes from a low potential level to a high potential level after elapsing one period, an edge detection signal 13 is outputted from the rising edge detecting circuit 4. In response to the generation of the edge detection signal 13, the addition or addend data generating circuit 3 starts operation.

As shown in FIG. 2, the addend data generating circuit 3 right-shifts the count value, having 16 bits in this embodiment, of the up counter 2 by three bits, and outputs an addend data 16 to the addition circuit 5.

In the addition circuit 5, the addend data 16 is added to a data to be added or augend data 15 which is a count value of the up/down counter 1. The data obtained by this addition is stored in the addition result register 7 in synchronization with a falling edge of the edge detection signal 13. The discrimination result signal 20 which is the sign bit of the addition result register 7 shows a result of duty cycle discrimination.

In this case, the lower three bits of the up counter 2 are neglected in the addend data generating circuit 3 and a rounding error is caused thereby. However, for example, if a frequency of the count clock signal 12 is determined such that 100 or more count clock pulses of the count clock signal 12 are inputted during one period of the signal to be discriminated 10, it is possible to reduce the error of the threshold point of the duty cycle discrimination to 0.4% or smaller, as shown in FIG. 12.

In the VISS detection, the shortest period of the signal to be discriminated 10 is approximately 10 KHz. Therefore, in this case, if the period of the count clock signal 12 is selected to be 1 $\mu$s, it is possible to supply 100 or more count clock pulses to the up counter 2 within one period of the signal to be discriminated 10. In a usual VTR, it is possible to produce the count clock signal 12 having a period of 1 $\mu$s.

FIG. 3 shows a condition in which the signal to be discriminated 10 having a duty cycle of 27.5%, corresponding to the VISS signal, is inputted to the duty cycle discriminating circuit. Assume that 100 count clock pulses of the count clock signal 12 are inputted during one period of the signal to be discriminated 10. In this case, the time length during which the signal to be discriminated 10 is in a high potential level is shorter than the time length during which the signal to be discriminated 10 is in a low potential level. Therefore, the count value of the up/down counter 1 after one period of the signal to be discriminated 10 becomes negative.

The absolute value "m" of the count value becomes 45 counts, that is, 45% of the counts corresponding to one period of the signal to be discriminated 10. The addend data 16 from the addend data generating circuit 3 is one eighth of the count value (n=100 counts) of the up counter 2, and becomes 12 counts, that is, 12.5% of the counts corresponding to one period of the signal to be discriminated 10. Therefore, addition result of the addition circuit 5 becomes negative, so that the discrimination result signal 20 becomes "1", and the absolute value of the addition result becomes 33 counts, that is, 32.5% of the count corresponding to one period of the signal to be discriminated 10.

On the other hand, although not shown in FIG. 3, assume that the signal to be discriminated 10 having a duty cycle of 60%, corresponding to the non-VISS signal, is inputted to the duty cycle discriminating circuit. Here, it is also assumed that the number of count clock pulses of the count clock signal 12 supplied during one period of the signal to be discriminated 10 is 100 pulses.

In this case, the time length during which the signal to be discriminated 10 is in a high potential level is longer than the time length during which the signal to be discriminated 10 is in a low potential level. Therefore, the count value of the up/down counter 1 after one period of the signal to be discriminated 10 becomes positive. Also, the absolute value of the count value becomes 20 counts, that is, 20% of the count corresponding to one period of the signal to be discriminated 10.

The addend data 16 from the addend data generating circuit 3 becomes 12 counts, that is, 12.5% of the counts corresponding to one period of the signal to be discriminated 10, and this is the same as the addend data of the above-mentioned case in which duty cycle of the signal to be discriminated 10 is 27.5%. Therefore, addition result of the addition circuit 5 becomes positive, so that the discrimination result signal 20 becomes "0", and the absolute value of the addition result becomes 33 counts, that is, 32.5% of the count corresponding to one period of the signal to be discriminated 10.

This absolute value is the same as that of the case in which the duty cycle of the signal to be discriminated 10 is 27.5%. This fact shows that the threshold point of the duty cycle discrimination becomes the middle point between the duty cycle of 27.5% and the duty cycle of 60%.

As mentioned above, when the duty cycle discriminating circuit according to the first embodiment of the present invention is applied to the VISS detection, it is possible to select the threshold point of duty cycle discrimination to be approximately 44% and, thereby, to discriminate the duty cycle of the signal to be discriminated 10 by using the middle threshold point between the duty cycle corresponding to the VISS signal and the duty cycle corresponding to the non-VISS signal.

In case of a VTR, the signal to be discriminated 10 is a playback signal (PBCTL signal) from a videotape, and, therefore, there is a possibility that the duty cycles of the PBCTL signal somewhat deviate from those of the specified value, that is, 60% and 27.5%.

In order to avoid erroneous discrimination even in such case, it is very important to perform the duty cycle discrimination not by using the threshold point of 50% but by using the middle threshold point, that is, approximately 44%, between 60% and 27.5%.

Also, when the videotape is wound forward (fast-forward) or rewound in a VTR and the period of the signal to be discriminated 10 continuously vary, the count value of the up/down counter 1 does not depend on the period, but depends on the ratio between the time during which the signal to be discriminated 10 is in a high potential level and the time during which the signal to be discriminated 10 is in a low potential level. Therefore, even in such case, the duty cycle discriminating circuit according to the present invention can perform the discrimination correctly. Also, since the addend data 16 is produced in the addend data generating circuit 3 based on the count value of the up counter 2 which corresponds to the period of the signal to be discriminated 10, the duty cycle discriminating circuit according to the present invention can correctly operate even if the period of the signal to be discriminated 10 varies greatly.

Figure 10:
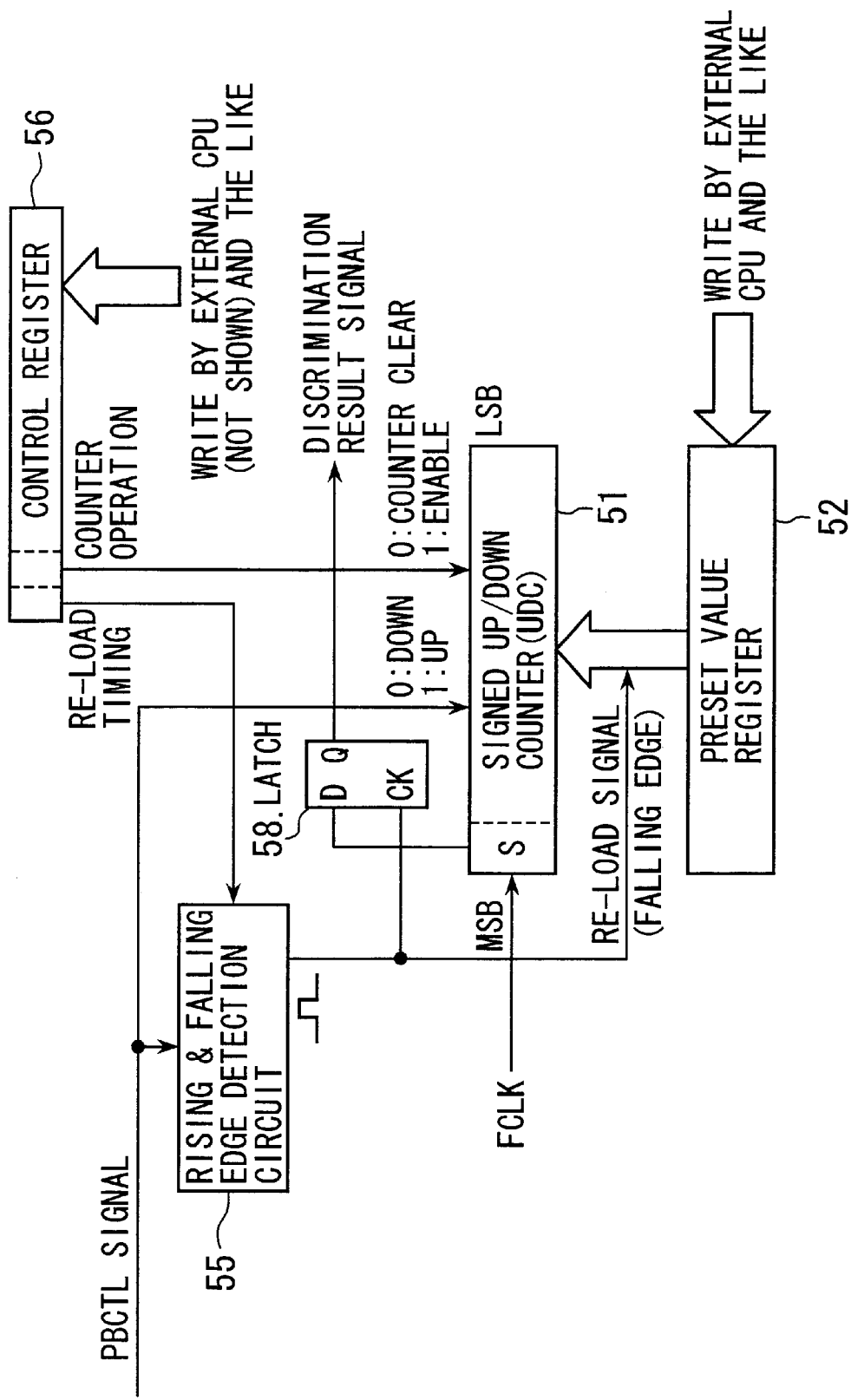
FIG. 10 is a block circuit diagram showing a structure of a conventional duty cycle discriminating circuit.
Figure 11:
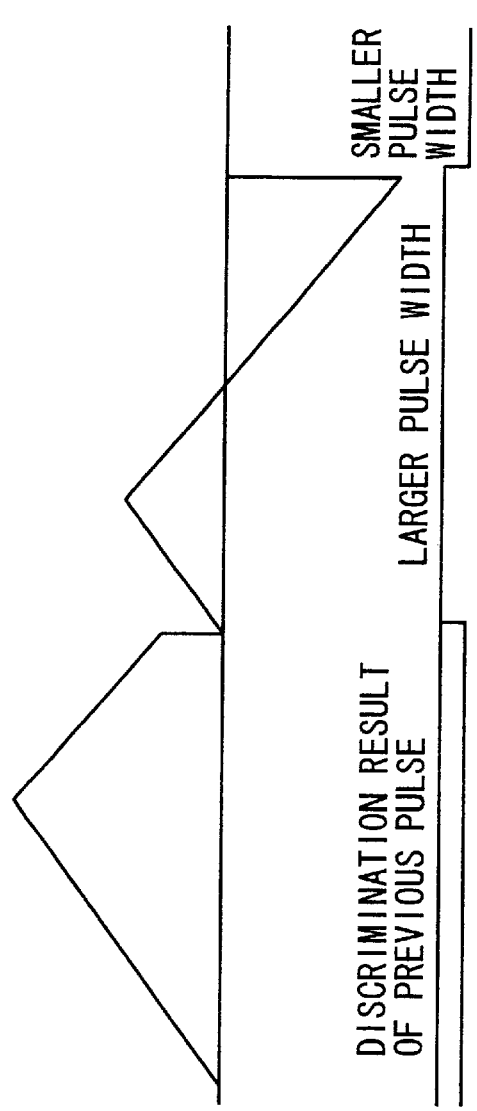
FIGS. 11A through 11C are timing diagrams used for explaining an operation of the conventional duty cycle discriminating circuit shown in FIG. 10.

In the conventional duty cycle discriminating circuit shown, for example, in FIG. 10, when the period of the PBCTL signal varies, it was necessary to store a preset value into the preset value register 52 every period of the PBCTL signal. Since the up/down counter 51 must be preset to a predetermined value before inputting the PBCTL signal to the up/down counter 51, it is necessary that the preset value is produced in anticipation of the next period.

Such operation requires control by an external CPU. Also, the preset value is a predicted value and, therefore, there is a possibility that a discrimination error becomes large. On the other hand, in the present invention, after elapsing one period of the signal to be discriminated 10, the preset data is automatically generated based on the elapsed period. Therefore, control by an external CPU and the like is not required, and a discrimination error can be very small which, in the above-mentioned example, can be 0.42% at the maximum.

Figure 6:
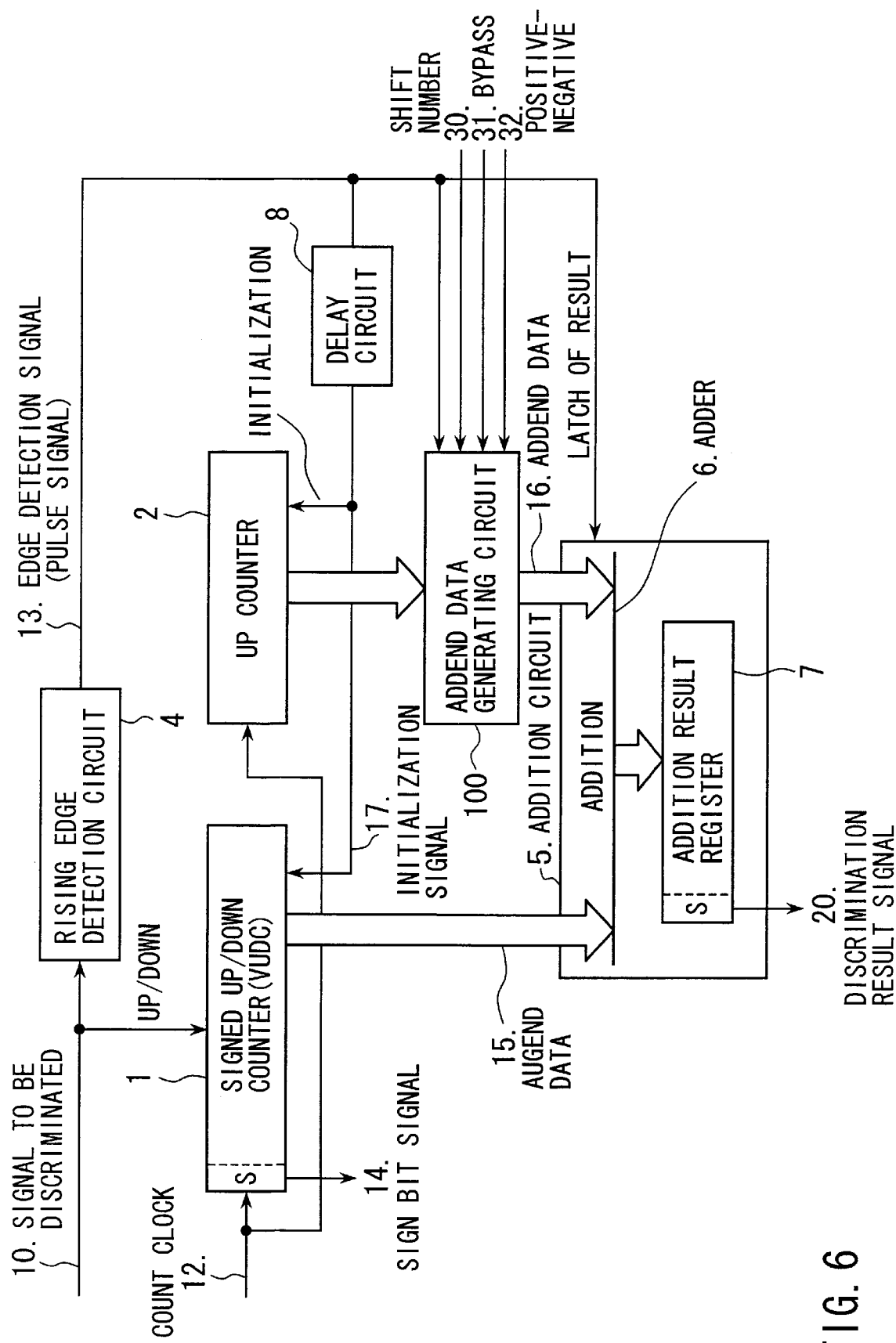
FIG. 6 is a block circuit diagram showing a structure of a duty cycle discriminating circuit according to the second embodiment of the present invention.

Next, with reference to the drawings, an explanation will be made on the second embodiment of the present invention. FIG. 6 shows a block circuit structure of a duty cycle discriminating circuit according to the second embodiment of the present invention.

As shown in FIG. 6, the duty cycle discriminating circuit according to the second embodiment has an addition or addend data generating circuit 100 which is different from the addend data generating circuit 3 of the first embodiment.

The addend data generating circuit 100 receives a shift number designating signal 30, a bypass designating signal 31, a positive or negative (sign) designating signal 32, and a count value of the up counter 2, and outputs an addend data 16.

Figure 7:
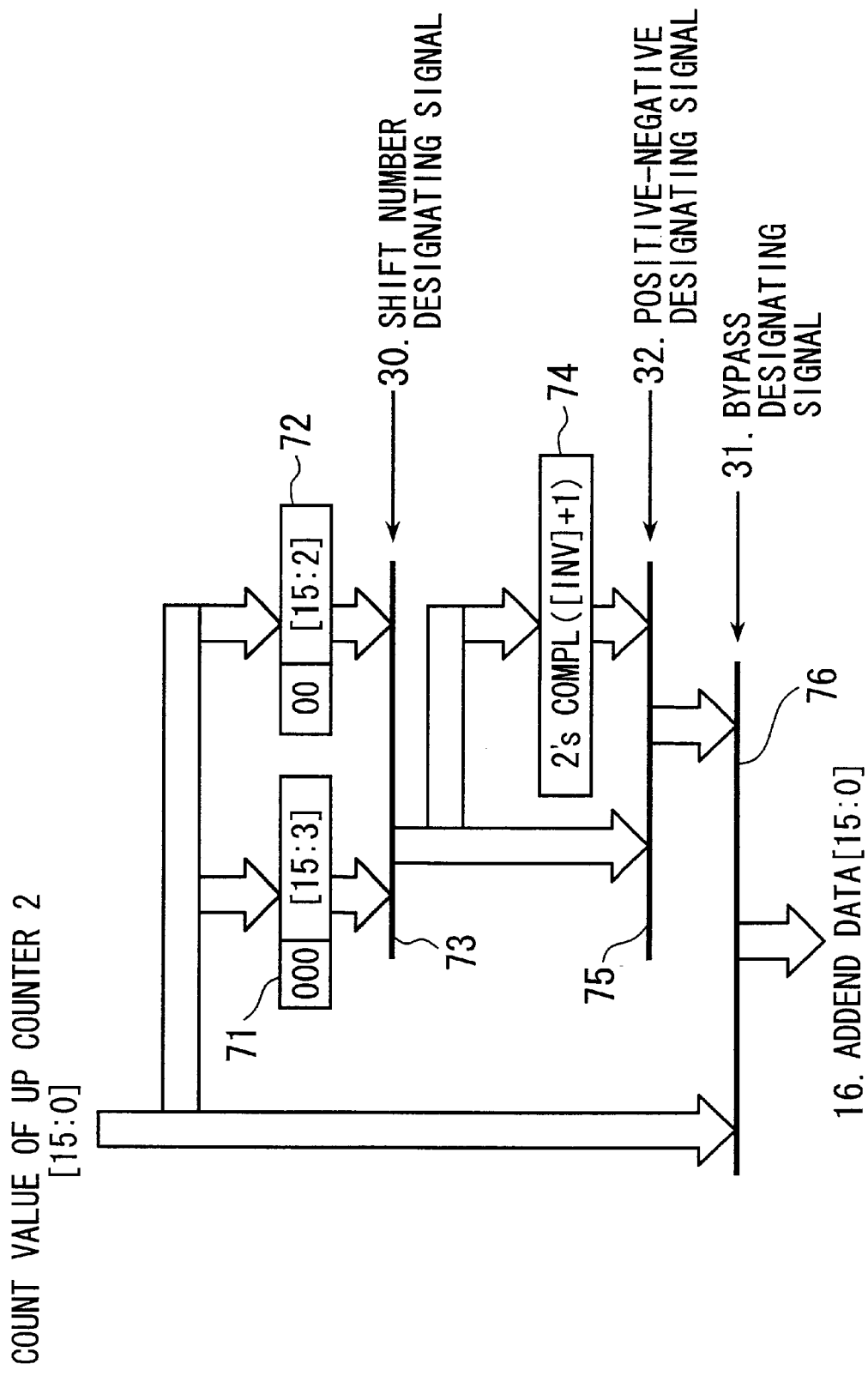
FIG. 7 is a block circuit diagram showing a detailed structure of an addition data generating circuit used in the duty cycle discriminating circuit of FIG. 6.

FIG. 7 shows a detailed structure of the addend data generating circuit 100 of the duty cycle discriminating circuit according to the second embodiment. The addend data generating circuit 100 comprises registers 71 and 72, selectors 73, 75 and 76, and a complementary number generating circuit 74.

In the addend data generating circuit 100, the register 71 receives the count value of the up counter 2 (16 bits length) and right-shifts the count value by three bits to generate a first data signal whose upper three bits are all zeros (0, 0, 0, [15:3]). Alternatively, the register 71 receives the count value of the up counter 2 (16 bits length) after right-shifting the count value by three bits, and generates a first data signal whose upper three bits are all zeros (0, 0, 0, [15:3]). Here the symbol [15:3] shows bit 15 through bit 3. The register 72 receives the count value of the up counter 2 (16 bits length) and right-shifts the count value by two bits to generate a second data signal whose upper two bits are all zeros (0, 0, [15:3]). Alternatively, the register 72 receives the count value of the up counter 2 (16 bits length) after right-shifting the count value by two bits. The selector 73 selects one of the first and second data signals depending on the shift number designating signal 30.

The complementary number generating circuit 74 generates a 2's complement data of the output data from the selector 73. The 2's complement data is generated by inverting the output data from the selector 73 and by adding "1" to the inverted data. The selector 75 selects one of the output data from the selector 73 and the 2's complement data depending on the positive-negative designating signal 32. Also, the selector 76 selects one of the output data from selector 75 and the count value of the up counter 2 depending on the bypass designating signal 31. The output of the selector 76 becomes the addend data 16 having 16 bits length ([15:0]). The most significant bit (MSB) of the addend data 16 functions as a sign bit.

An operation of the duty cycle discriminating circuit according to the second embodiment will now be described. The duty cycle discriminating circuit according to the second embodiment is characterized in that the threshold point of duty cycle discrimination of the signal to be discriminated 10 can be selected from a plurality of points.

An operation of the duty cycle discriminating circuit according to the second embodiment is the same as that of the duty cycle discriminating circuit according to the first embodiment, except that an operation of the addend data generating circuit 100 of the second embodiment differs from that of the addend data generating circuit 3 of the first embodiment. Therefore, an explanation will be made only on the addend data generating circuit 100, and detailed explanation of other portions of the duty cycle discriminating circuit according to the second embodiment is omitted here.

In the addend data generating circuit 100, the absolute value of the addend data 16 can be changed by selecting the shift number of the count value of the up/down counter 2 depending on the shift number designating signal 30. When the addend data 16 is made positive, if the selector 73 selects the data signal from the register 71, that is, the data obtained by shifting the count value of the up counter 2 by three bits, the threshold point of the duty cycle discrimination becomes approximately 44% (43.75%). If the selector 73 selects the data from the register 72, that is, the data obtained by shifting the count value of the up counter 2 by two bits, the threshold point of the duty cycle discrimination becomes approximately 38% (37.5%).

Also, in the selector 75, it is possible to select one of the output data from the selector 73 and the 2's complement data, depending on the positive-negative designating signal 32, thereby it is possible to select a positive value or a negative value of the addend data 16. When a negative value of the addend data 16 is selected, the negative value is added to the count value of the up/down counter 1 in the addition circuit 5, that is, the output data from the selector 73 is subtracted from the count value of the up/down counter 1. Therefore, it becomes possible to set the threshold point of the duty cycle discrimination to be larger than 50%. Also, in the selector 76, it is possible to select the count value of the up counter 2. In such case, the count value of the up counter 2 itself becomes the addend data 16, and it is possible to set the threshold point of the duty cycle discrimination to be 50%.

As shown in FIG. 13, in the duty cycle discriminating circuit according to the second embodiment, it is possible to select the threshold points of duty cycle discrimination depending on the values of the various designating signals, i.e., the shift number designating signal 30, the positive-negative designating signal 32 and the bypass designating signal 31.

In the duty cycle discriminating circuit according to the second embodiment, the shift number of the count value of the up counter 2 can be 3 bits and 2 bits. However, it is possible to use other shift numbers to change the threshold point of duty cycle discrimination. Thereby, it is possible to provide a multipurpose duty cycle discriminating circuit which is also applicable to various circuits and apparatuses other than VTR.

Figure 8:
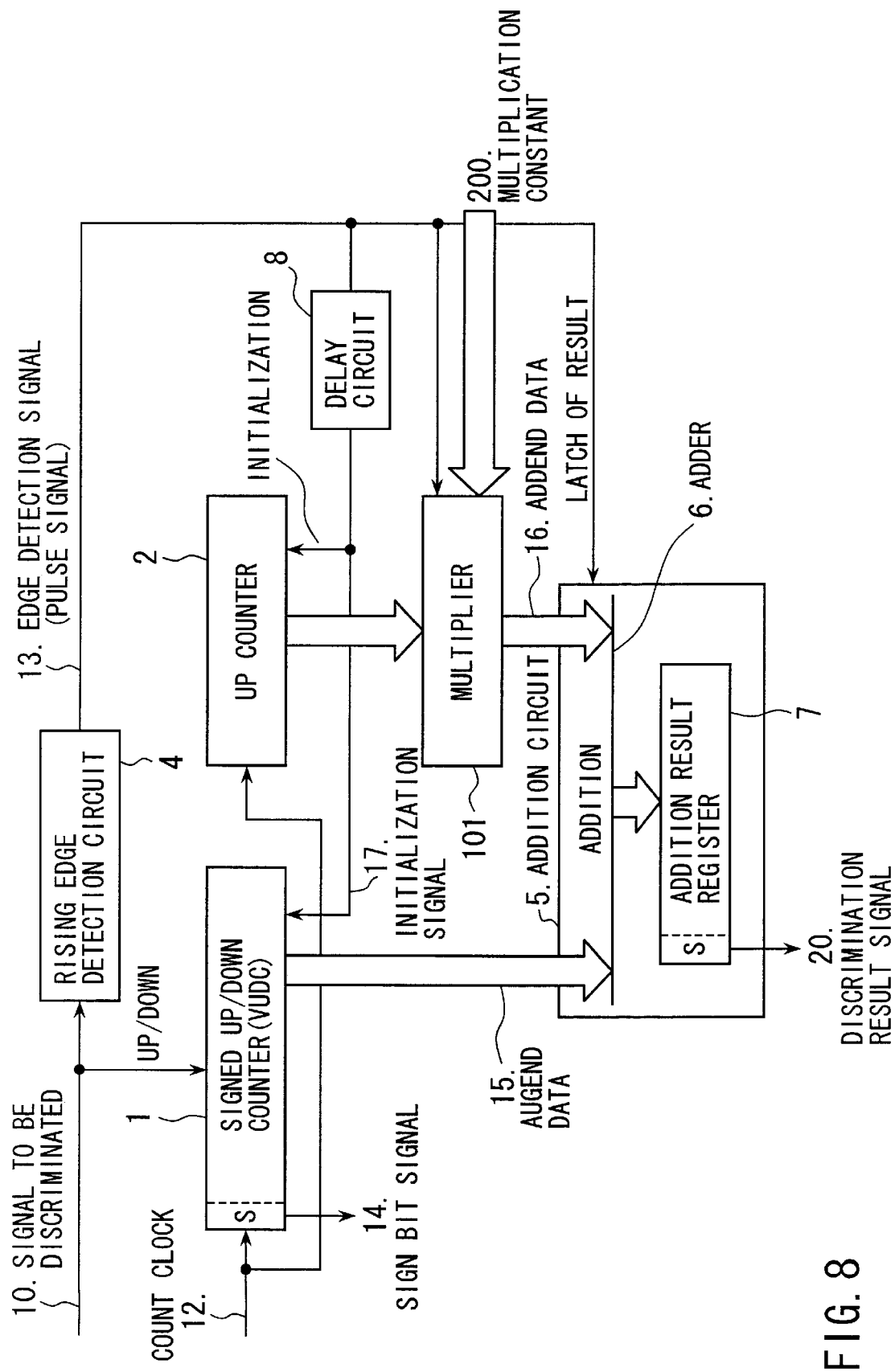
FIG. 8 is a block circuit diagram showing a structure of a duty cycle discriminating circuit according to the third embodiment of the present invention.

An explanation will now be made on a duty cycle discriminating circuit according to the third embodiment of the present invention. FIG. 8 shows a block circuit structure of a duty cycle discriminating circuit according to the third embodiment of the present invention.

As shown in FIG. 8, the duty cycle discriminating circuit according to the third embodiment has the same structure as that of the duty cycle discriminating circuit according to the first embodiment, except that, in the third embodiment, a multiplier 101 is used in place of the addend data generating circuit 3 of FIG. 1.

The multiplier 101 receives the count value of the up counter 2 and the edge detection signal 13 from the rising edge detecting circuit 4. The multiplier 101 also receives a multiplication constant designating signal 200. The multiplier 101 outputs an addend data 16 which is supplied to the addition circuit 5.

An operation of the duty cycle discriminating circuit according to the third embodiment will now be described. The duty cycle discriminating circuit according to the third embodiment is characterized in that the threshold point of duty cycle discrimination of the signal to be discriminated 10 can be determined arbitrarily.

As mentioned above, in the duty cycle discriminating circuit according to the second embodiment, the count value of the up counter 2 is shifted to generate the addend data 16. Therefore, it is only possible to set the addend data to $1/(2^n)$ of the count value of the up counter 2, where n is a positive integer. Thus, in the duty cycle discriminating circuit according to the second embodiment, it is only possible to set the threshold point of the duty cycle discrimination to one of the limited number of values.

In the duty cycle discriminating circuit according to the third embodiment, the count value of the up counter 2 and the constant inputted as the multiplication constant designating signal 200 are multiplied in synchronization with input of the edge detection signal 13.

Here, the multiplication constant designating signal 200 is constituted of four (4) bits, and it is possible to represent values from $1/16$ (0.0625) to $15/16$ (0.9375) with a step of $1/16$. Therefore, by using such multiplication constant designating signal 200, it is possible to obtain the threshold points of duty cycle discrimination as shown in FIG. 14.

Operation of the multiplier 101 itself is well known and description thereof is omitted here. Also, operation of the duty cycle discriminating circuit according to the third embodiment is the same as that of the duty cycle discriminating circuit according to the first embodiment, except for the above-mentioned operation concerning the multiplier 101, and detailed description thereof is omitted here.

In the third embodiment, the multiplication constant designating signal 200 is constituted of four bits. However, by increasing the number of bits of the multiplication constant designating signal 200, it becomes possible to more finely select the threshold point of duty cycle discrimination. Also, in the present embodiment, the output data from the multiplier 101, that is, the addend data 16, is supplied as a positive number to the addition circuit 5. However, it is possible to obtain 2's complement of the output data and to output as a negative number. In such case, the threshold point of duty cycle discrimination can be a value of the latter half of the pulse signal to be discriminated, that is, 50% or larger.

Figure 9:
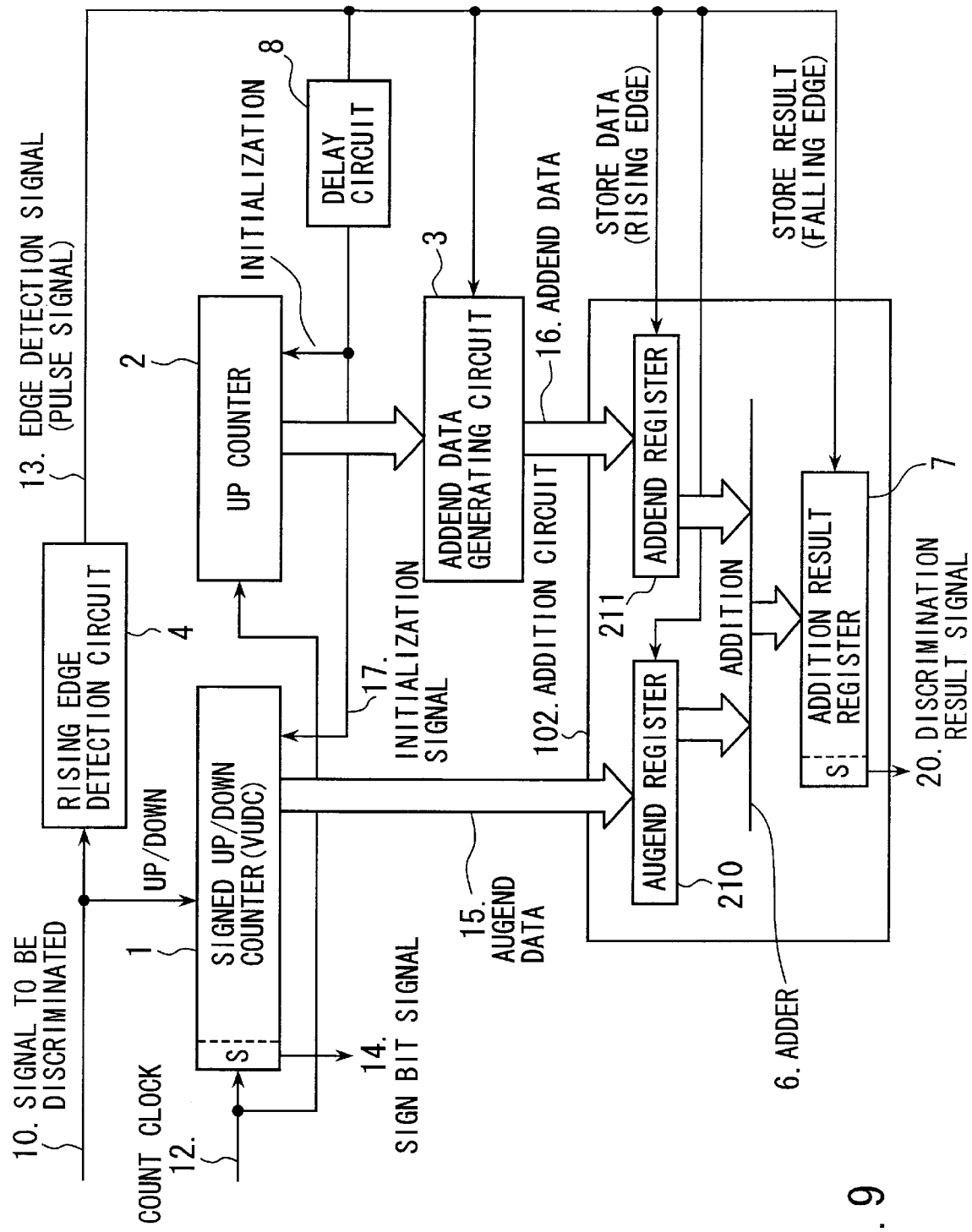
FIG. 9 is a block circuit diagram showing a structure of a duty cycle discriminating circuit according to the fourth embodiment of the present invention.

Next, with reference to the drawing, an explanation will be made on the fourth embodiment of the present invention. FIG. 9 shows a block circuit structure of a duty cycle discriminating circuit according to the fourth embodiment of the present invention.

As shown in FIG. 9, the duty cycle discriminating circuit according to the fourth embodiment has the same structure as that of the duty cycle discriminating circuit according to the first embodiment, except that, in the fourth embodiment, a structure of an addition circuit 102 is different from that of the addition circuit 5 in the first embodiment.

The addition circuit 102 comprises an augend register 210, an addend register 211, an adder 6, and an addition result register 7. The augend register 210 stores therein an augend data 15 in response to a rising edge of the edge detection signal 13. The addend register 211 stores an addend data 16 therein in response to a rising edge of the edge detection signal 13. The adder 6 performs an addition operation of the data stored in the augend register 210 and the data stored in the addend register 211. The addition result register 7 stores a result of addition by the adder 6 in response to a falling edge of the edge detection signal 13.

An operation of the duty cycle discriminating circuit according to the fourth embodiment will now be described. The duty cycle discriminating circuit according to the fourth embodiment is characterized in that the addition circuit 102 comprises the augend register 210 and the addend register 211. The augend register 210 and the addend 211store therein the augend data 15 and the addend data 16, respectively, in synchronization with generation of the edge detection signal 13.

Therefore, it is possible to initialize the signed up/down counter 1 and the up counter 2 by the initialization signal 17, without waiting an execution of operation of the addition circuit 102. It is only necessary that the initialization signal 17 is outputted after a delay time during which the augend register 210 and the addend register 211 can store data therein. Therefore, it is possible to minimize the time from a rising edge of the signal to be discriminated 10 to the generation of the initialization signal 17.

In this way, since the initialization signal 17 can be outputted speedily, it is possible to go to the next duty cycle discrimination soon after detecting a rising edge of the signal to be discriminated 10. Also, even when the period of the count clock signal 12 becomes short, it is possible to use the count clock signal 12 efficiently for duty cycle discrimination, without wasting or invalidating the count clocks.

Operation of the duty cycle discriminating circuit according to the fourth embodiment is the same as that of the duty cycle discriminating circuit according to the first embodiment, except for the above-mentioned operation concerning the addition circuit 102, and detailed description thereof is omitted here.

In summary, according to the present invention, it becomes possible to change the threshold point of duty cycle discrimination from 50% by adding, after elapsing one period of the signal to be discriminated 10, the data produced from the count value corresponding to the period of the signal to be discriminated 10 to the count value of the up/down counter 1. Also, it is not necessary to use an external CPU and the like for producing the threshold point of duty cycle discrimination, and it is possible to reduce an error of duty cycle discrimination.

Also, it is possible to produce the addend data 16 by using a simple circuit structure including a 3 bits shift circuit. By setting the threshold point of duty cycle discrimination to approximately 44%, it is possible to realize a VISS detection circuit in a VTR having a simple structure and having a reduced error of duty cycle discrimination.

In the above-mentioned second embodiment, it is possible to make a threshold point of duty cycle discrimination selectable from a plurality of threshold points, depending on the values of the various designating signals, i.e., the shift number designating signal, the positive-negative designating signal and the bypass designating signal inputted to the addition data generating circuit. Such feature is realized by using a relatively simple circuit structure.

In the duty cycle discriminating circuit according to the third embodiment, the multiplier is used for producing the addend data 16, and thereby it becomes possible to freely determine the ratio of the count value of the up counter 2 and the addend data 16. Therefore, it is possible to select the threshold point of duty cycle discrimination finely and freely.

In the duty cycle discriminating circuit according to the fourth embodiment, by providing the augend register 210 and the addend register 211, it is possible to initialize the signed up/down counter 1 and the up counter 2 and to go to the next duty cycle discrimination soon after the input of the signal to be discriminated 10.

Therefore, it is possible to shorten the period of the count clock signal and to increase the number of the count clock pluses inputted during one period of the signal to be discriminated 10. Thereby, it becomes possible to improve a precision of duty cycle discrimination.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A duty cycle discriminating circuit comprising:
an up/down counter with sign bit for counting up or counting down a count clock signal depending on a potential level of a signal to be discriminated;
an up counter for counting up said count clock signal regardless of the potential level of the signal to be discriminated;
an addend data generating circuit for producing an addend data having a value corresponding to a predetermined proportion of a count value of said up counter; and
an addition circuit with sign bit for adding a count value of said up/down counter and said addend data produced by said addend data generating circuit, said sign bit of said addition circuit with sign bit is outputted as a discrimination result signal of said duty cycle discriminating circuit;
wherein said predetermined proportion of said count value of said up counter is specified to perform duty cycle discrimination of said signal to be discriminated by using a desired threshold point of duty cycle discrimination.

2. A duty cycle discriminating circuit as set forth in claim 1, further comprising an edge detecting circuit which detects a leading edge of said signal to be discriminated and outputs a pulse like edge detection signal in response to the detection thereof.

3. A duty cycle discriminating circuit as set forth in claim 2, wherein said addend data generating circuit is a multiplier circuit which receives said count value of said up counter, said edge detection signal and a multiplication constant designating signal, and which multiplies said count value of said up counter and a constant inputted as said multiplication constant designating signal in synchronization with an input of said edge detection signal to generate said addend data.

4. A duty cycle discriminating circuit as set forth in claim 3, further comprising a delay circuit which receives said edge detection signal and delays said edge detection signal for a predetermined time to output an initializing signal.

5. A duty cycle discriminating circuit as set forth in claim 3, wherein said addition circuit comprises an adder for adding said count value of said up/down counter and said addend data produced by said addend data generating circuit, and an addition result register for storing a result of addition of said adder, a sign bit of said addition result register being outputted as a discrimination result signal of said duty cycle discriminating circuit.

6. A duty cycle discriminating circuit as set forth in claim 2, further comprising a delay circuit which receives said edge detection signal and delays said edge detection signal for a predetermined time to output an initializing signal.

7. A duty cycle discriminating circuit as set forth in claim 6, wherein said up/down counter is initialized by said initialization signal and the most significant bit (MSB) of said up/down counter is outputted as a sign bit.

8. A duty cycle discriminating circuit as set forth in claim 2, wherein said addition circuit comprises an augend data register for storing said count value of said up/down counter as an augend data in response to a rising edge of said edge detection signal, an addend data register for storing said addend data in response to said rising edge of said edge detection signal, an adder for adding said data stored in said augend data register and said data stored in said addend data register, and an addition result register for storing a result of addition of said adder in response to a falling edge of said edge detection signal.

9. A duty cycle discriminating circuit as set forth in claim 8, further comprising a delay circuit which receives said edge detection signal and delays said edge detection signal for a predetermined time to output an initializing signal.

10. A duty cycle discriminating circuit as set forth in claim 8, wherein, in said addend data generating circuit, said count value from said up counter is right shifted by a predetermined number of bit or bits and "0" is inserted to each of corresponding number of upper bit or bits to obtain said addend data.

11. A duty cycle discriminating circuit as set forth in claim 10, wherein said count value from said up counter has 16 bits and is right shifted by 3 bits and wherein "0" is inserted to each of the upper 3 bits of the right shifted data to obtain 16 bits data as said addend data.

12. A duty cycle discriminating circuit as set forth in claim 1, wherein said addition circuit comprises an adder for adding said count value of said up/down counter and said addend data produced by said addend data generating circuit, and an addition result register for storing a result of addition of said adder, a sign bit of said addition result register being outputted as the discrimination result signal of said duty cycle discriminating circuit.

13. A duty cycle discriminating circuit as set forth in claim 1, wherein, in said addend data generating circuit, said count value from said up counter is right shifted by a predetermined number of bit or bits and "0" is inserted to each of corresponding number of upper bit or bits to obtain said addend data.

14. A duty cycle discriminating circuit as set forth in claim 13, wherein said count value from said up counter has 16 bits and is right shifted by 3 bits and wherein "0" is inserted to each of the upper 3 bits of the right shifted data to obtain 16 bits data as said addend data.

15. A duty cycle discriminating circuit as set forth in claim 1, wherein said addend data generating circuit comprises a plurality of registers storing count values from said up counter after right shifting said count value by different number of bits respectively, and a first selector for selectively outputting data stored in said registers depending on a shift number designating signal.

16. A duty cycle discriminating circuit as set forth in claim 15, wherein said addend data generating circuit further comprises a complementary circuit which receives said data outputted from said first selector and generates a complementary data of said data outputted from said first selector, and a second selector for selectively outputting said data outputted from said first selector or said complementary data depending on a positive-negative designating signal.

17. A duty cycle discriminating circuit as set forth in claim 16, wherein said addend data generating circuit further comprises a third selector for selectively outputting said data outputted from said second selector or said count value of said up down counter depending on a bypass designating signal.

* * * * *